(12) United States Patent
Kojima

(10) Patent No.: US 6,388,456 B1
(45) Date of Patent: May 14, 2002

(54) PROBE CARD AND MANUFACTORING METHOD THEREFOR

(75) Inventor: Akio Kojima, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/550,341

(22) Filed: Apr. 14, 2000

(30) Foreign Application Priority Data

Apr. 16, 1999 (JP) .......................................... 11-109977

(51) Int. Cl.[7] .............................................. G01R 31/02
(52) U.S. Cl. ..................................... 324/754; 324/761
(58) Field of Search ................................. 324/754, 765, 324/72.5, 758, 761, 762; 439/482; 257/696; 29/843

(56) References Cited

U.S. PATENT DOCUMENTS

| | | | | |
|---|---|---|---|---|
| 3,867,698 A | * | 2/1975 | Beltz et al. ................ | 324/762 |
| 5,090,118 A | * | 2/1992 | Kwon et al. ................ | 29/843 |
| 5,134,365 A | * | 7/1992 | Okubo et al. ................ | 324/754 |
| 5,670,889 A | * | 9/1997 | Okubo et al. ................ | 324/760 |
| 6,014,032 A | * | 1/2000 | Maddix et al. ............. | 324/762 |
| 6,184,576 B1 | * | 2/2001 | Jones et al. ................. | 257/696 |

* cited by examiner

*Primary Examiner*—Ernest Karlsen
*Assistant Examiner*—Minh N. Tang
(74) *Attorney, Agent, or Firm*—Rosenthal & Osha L.L.P.

(57) ABSTRACT

A probe card which comes in contact with electrodes of electric components so as to test characteristics of the electric components, includes: a printed board having a plurality of first transmission lines; a build-upboard, attached on the printed board, which includes a plurality of second transmission lines connected to a plurality of the first transmission lines, respectively; and a plurality of probe needles connected to a plurality of the second transmission lines so as to come in contact with the electrodes of the electric components. A method of manufacturing such a probe card includes: forming a first transmission line in a first substrate; superposing a second substrate on the first substrate; forming a second transmission line to the second substrate; cutting the first and second substrates in a predetermined shape; and forming a probe needle on the second substrate.

21 Claims, 6 Drawing Sheets

*Fig. 5A* SECOND WIRING LAYER
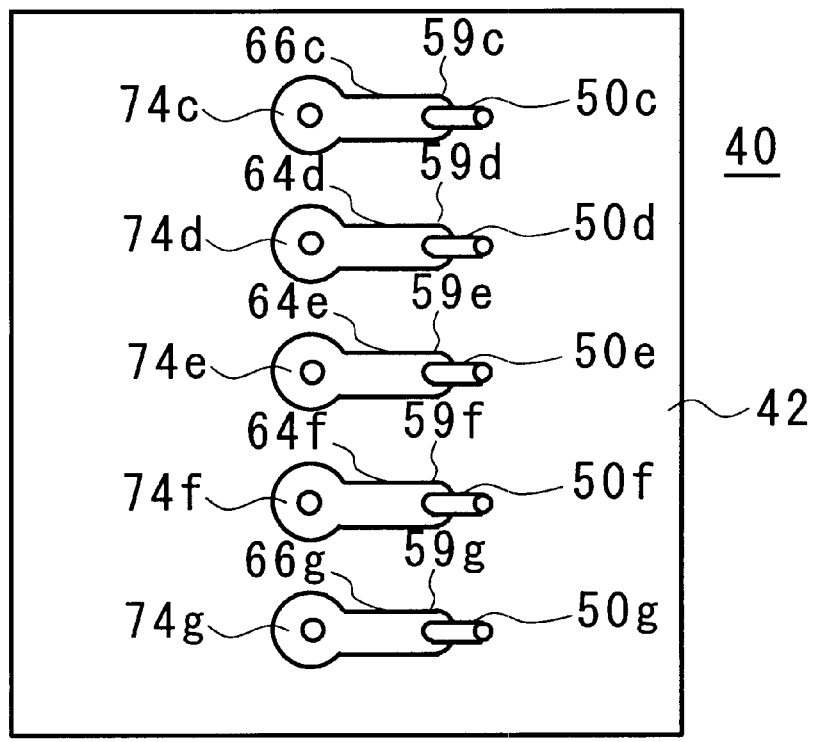
*Fig. 5B* FIRST WIRING LAYER
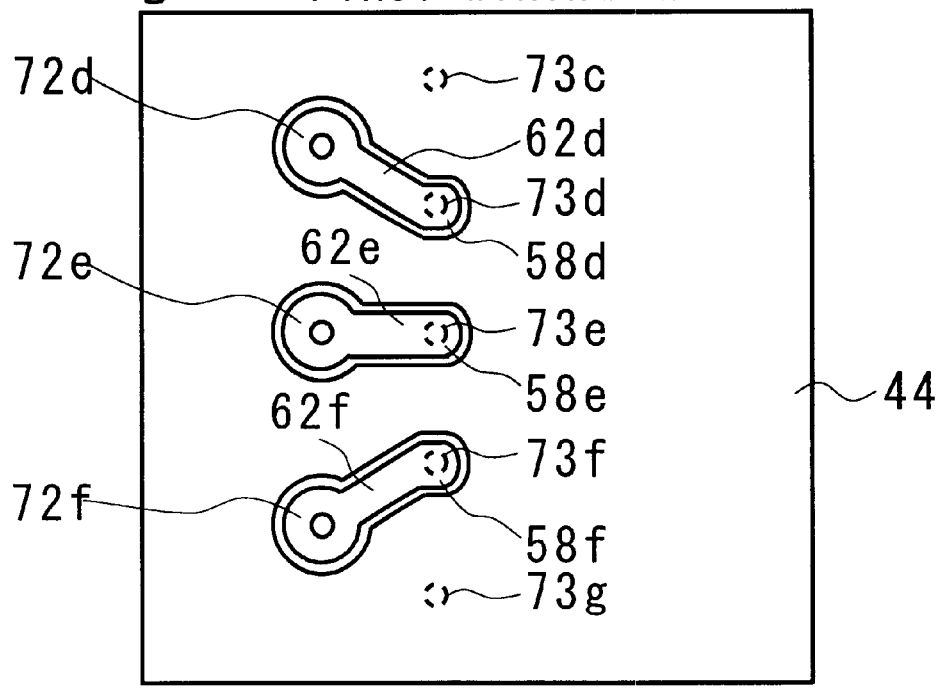

PROBE CARD AND MANUFACTORING METHOD THEREFOR

This patent application claims priority based on Japanese patent application, H11-109977 filed on Apr. 16, 1999, the contents of which are incorporated herein by reference.

BACKGROUND OF THE INVENTION

1. Field of the Invention

The present invention relates to a probe card which is used for testing electric characteristics of electric components such as IC chip and LSI chip and so on, and in particular to the probe card in which position accuracy and signal quality of probe needles thereof are increased.

2. Description of the Related Art

FIG. 1 is a cross sectional view of a conventional probe card. The conventional probe card is comprised of: a printed circuit 10; a plurality of probe needles 20 (20a and 20b), a plurality of soldering portions 24 (24a and 24b); a plurality of fixing resin portions 26 (26a and 26b); and a plurality of fixed bases 28 (28a and 28b). The printed circuit 10 includes a plurality of transmission lines 22 (22a and 22b). The probe card is used for performing an electric characteristic test (probe test) of electric components such as IC chip, LSI chip and so on.

The probe needle 20 is of a cantilever type being supported in an open-sided manner. A plurality of probe needles 20a and 20b are supported by a plurality of fixed bases 28a and 28b, whose cross sections are triangular, in a tilted manner. After the position of the probe needles 20 is adjusted manually, the probe needles 20 are fixed by a plurality of fixing resin portions 26a and 26b. The respective probe needles 20a and 20b are connected to the respective transmission liens 22a and 22b by soldering portions 24a and 24b, respectively.

When a board whose position accuracy is low such as a glass epoxy board is used as the printed board 10, there is caused a problem in that the position of the probe needle 20 has to be manually adjusted when connecting the probe needle 20. Moreover,when using the board of low position accuracy, it is difficult to make narrow a pitch and an interval between a plurality of probe needles 20a and 20b.

SUMMARY OF THE INVENTION

Therefore, it is an object of the present invention to provide a probe card and a manufacturing method therefor which overcome the above issues in the related art. This object is achieved by combinations described in the independent claims. The dependent claims define further advantageous and exemplary combinations of the present invention.

According to one aspect of the present invention, there is provided a probe card which comes in contact with electrodes of electric components so as to test characteristics of the electric components, the probe card comprising: a printed board having a plurality of first transmission lines; a build-up board, attached on said printed board, which includes a plurality of second transmission lines connected to a plurality of the first transmission lines, respectively; and a plurality of probe needles connected to a plurality of the second transmission lines so as to come in contact with the electrodes of the electric components.

Preferably, the printed board includes a flat portion and a central protrusion provided on a substantially central surface of the flat portion, and the build-up board is attached on the central protrusion.

Moreover, the build-up board is preferably made in a film-like shape and is attached to the printed board in a fully strained manner.

Moreover, the build-up board is preferably made of an epoxy material.

Preferably, each of a plurality of the first transmission lines includes a plurality of first and second pads at both ends thereof, each of a plurality of the second transmission lines includes a plurality of third pads at each end thereof, and each of a plurality of the second pads is connected to each of a plurality of second transmission lines, and a plurality of the third pads is connected to a plurality of the probe needles.

Moreover, it is preferable that a plurality of the probe needles has elasticity in vertical directions and such that one end connected to each of a plurality of the thirds pads is displaced in horizontal directions from other end which comes in contact with each of the electrodes.

According to another aspect of the present invention, there is provided a method of manufacturing a probe card for use in testing characteristics of electric components, the method comprising: forming a first transmission line in a first substrate; superposing a second substrate on the first substrate; forming a second transmission line to the second substrate; cutting the first and second substrates in a predetermined shape; and forming a probe needle on the second substrate.

In the method in which the first substrate includes a flat portion, a substantially central protrusion provided on a top surface of a substantially center of the flat portion and a peripheral salient which is disposed away from the central protrusion with a predetermined distance away and which is provided on the top surface of a peripheral-side flat portion, the cutting preferably includes: cutting the second substrate a long a periphery of the central salient, and cutting the first substrate along an inner periphery of the peripheral salient.

Moreover, the forming the probe needle preferably includes forming simultaneously a plurality of the probe needles.

Moreover, the forming the probe needle preferably includes: fixing, by a bonding machine which fixes a wire on a substrate, a tip portion of the wire to the second substrate; and cutting a portion above the tip portion of the wire by heating the portion.

This summary of the invention does not necessarily describe all necessary features so that the invention may also be a sub-combination of these described features.

BRIEF DESCRIPTION OF THE DRAWINGS

FIG. 5A shows the second wiring layer formed on a substrate 42.

FIG. 5B shows the first wiring layer of the build-up board 40.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

First Embodiment

Figure 1:
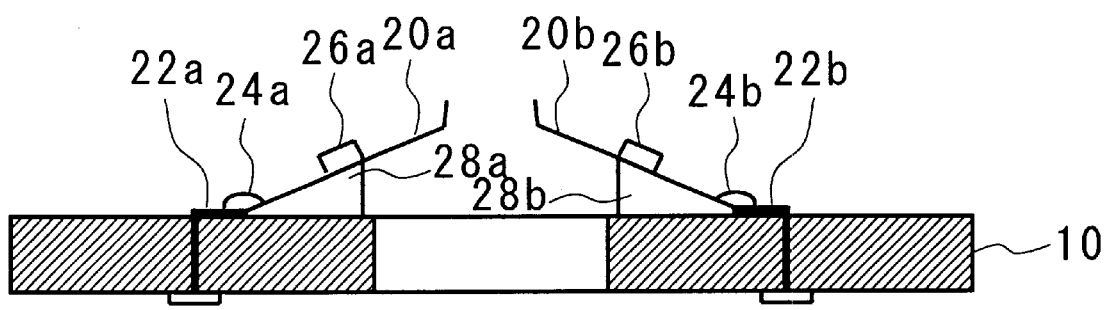
FIG. 1 is a cross sectional view of a conventional probe card.
Figure 2:
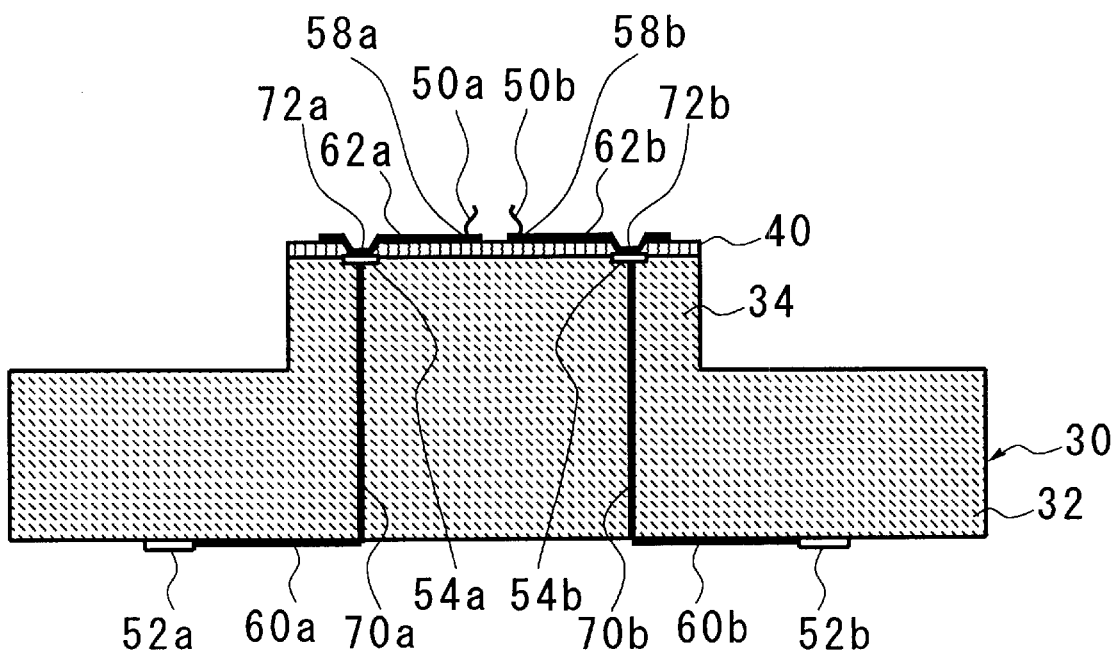
FIG. 2 is a cross sectional view of a probe card according to the first embodiment.

FIG. 2 is a cross sectional view of a probe card according to the first embodiment. The probe card according to the first embodiment comprises: a printed board 30; a build up board 40 and a plurality of probe needles 50, i.e. in this example, two prove needles 50a and 50b. The probe card is used for performing electric characteristic test (probe test) of electric components such as IC chip, LSI chip and so on.

The printed board 30 is a glass epoxy laminated substrate, and includes a flat portion 32 and a central salient 34 which is provided on the central surface of the flat portion 32. The build-up board 40 is a film-like epoxy substrate, and is attached to on the top surface of the central salient 34 in a fully strained manner. In the present embodiment, the build-up board is attached thereto in a fully strained manner by using adhesives. The printed board 30 has a hard surface of high flatness and mechanical strength and thickness enough to resist deflection. The build-up board 40 is film-like and soft, so that the flatness and mechanical strength are low. However, the degree of the flatness and mechanical strength of the build-up board 40 become high by attaching the build-up board 40 to on the top surface of the printed board 30 in a fully strained manner. The build-upboard 40 includes a wiring layer provided on the top surfaces of epoxy layers. The build-up board 40 may be of a multi-layered structure provided with a plurality of wiring layers. For instance, the wiring layers may be of two layered structure by placing one epoxy material upon another epoxy material.

It is to be noted that in this patent specifications including claim phraseology, a board and a substrate are used interchangeably.

A plurality of the first transmission lines 60a and 60b are provided on the printed board 30. A plurality of the first transmission lines 60a and 60b include transmission lines provided on the bottom surface of the printed board 30 and a plurality of through holes provided in predetermined positions of the printed board 30. On one end of each of a plurality of the first transmission lines 60a and 60b there are provided a plurality of first pads 52a and 52b on the bottom surface of the printed board 30, respectively. On other end of each of a plurality of the first transmission lines 60a and 60b there are provided a plurality of second pads 54a and 54b on the top surface of the printed board 30.

A plurality of second transmission lines 62a and 62b are provided on the top surface of the build-up board 40. On one end of each of a plurality of the second transmission lines 62a and 62b there are provided third pads 58a and 58b. Ground wires are provided in the vicinity of a plurality of the second transmission lines 62a and 62b.

A plurality of the second transmission lines 62a and 62b include a plurality of first vias 72a and 72b which are formed and plated in the inner side face of a micro hole penetrating the epoxy layer and on the base face of an opening. A plurality of the first vias 72a and 72b are in the form of being hollowed downwardly and are connected to a plurality of the second pads 54a and 54b provided there below, respectively. Thereby, a plurality of the second transmission lines 62a and 62b are connected to a plurality of the second pads 54a and 54b by way of a plurality of the first vias 72a and 72b. The surface of the first, second and third pads 52, 54 and 58 is plated by metal such as gold (Au) which has low contact resistance. Moreover, there maybe provided another pad separately by Au so as to be connected to the first and second transmission lines 60 and 62.

A plurality of probe needles 50a and 50b are formed on a plurality of the third pads 58a and 58b, respectively. In the present embodiment, the probe needles 50a and 50b are of S shape, and are fixed on a plurality of the third pads 58a and 58b, respectively. The length of the probe needles 50 is of a micro size such as approximately 2 mm. The S-shaped micro-sized probe needle has elasticity in the vertical directions due to a bent portion thereof. Moreover, the S-shaped micro-sized probe needle is shaped such that one end to be connected to the third pad 58 is displaced, in the horizontal direction, from other end to come in contact with electric components. Thereby, when the probe needle is pressed downwardly by an electrode of the electric components, the both ends of the micro-sized needle are further displaced in the horizontal direction so as to scrabble the electrode of the electric component which comes in contact with the probe. In this manner, the S-shaped micro-sized probe needle has a high degree of being contactable to electrodes. Moreover, various types of needles such as a cantilever-like needle and a cone-like bump may be utilized in place of the S-shaped micro-sized needle.

Since the micro-sized needles (referred to simply as micro needles) are used as a plurality of probe needles 50a and 50b in the present embodiment, the length of non-transmission lines can be made shorter so as increase reliability of signals. For instance, when the length of the micro-sized needle is approximately 2 mm, the probe needle can transmit signals of the GHz order. Moreover, since the micro needles are utilized as a plurality of probe needles 50a and 50b, the distance from capacitors provided in the printed board 30 to an electric component to be probe-tested can be made shorten so as to reduce a power supply noise.

Figure 3:
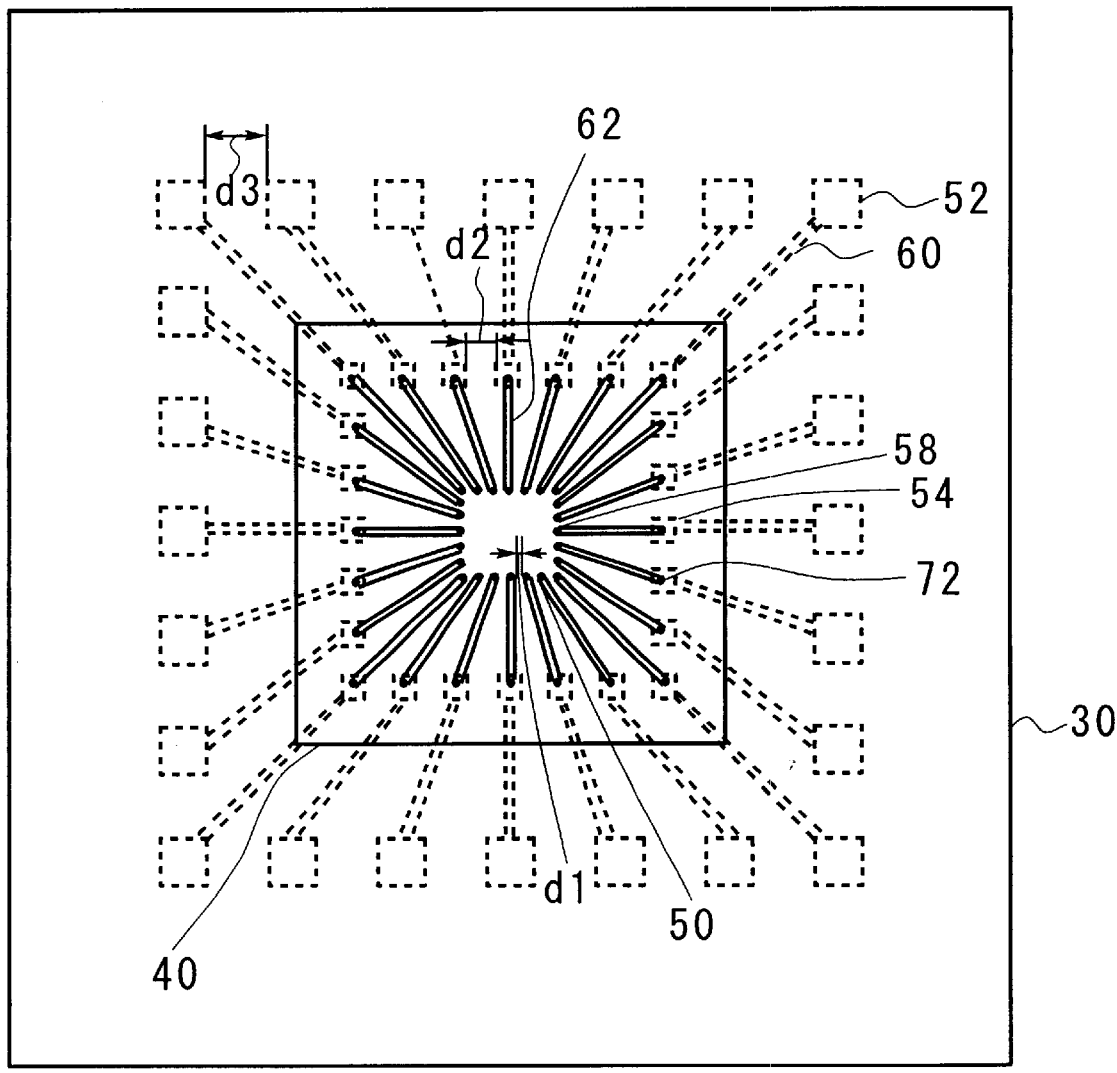
FIG. 3 is a plane view of the probe card.

FIG. 3 is a plan view of the probe card. On the top surface of the build-up board 40 attached in a fully strained manner on the substantially central protrusion of the printed board 30 there are provided a plurality of the second transmission lines 62. A plurality of probe needles 50 and a plurality of the third pads 58 are provided in positions corresponding to electrodes of the electric components which are subjects of the probe test.

A plurality of the second transmission lines 62 extend radially on the top face of the build-up board 40 from the third pad 58 in the outward direction, so that there are provided a plurality of the first vias in one end in the outward side. The pitch of the third pad 58 is narrower than that of the second pad 54. The interval between a plurality of the third pads 58 (that is an interval between ends of the pads) is narrower than that of a plurality of transmission lines.

In the printed board 30 there are provided a plurality of the first transmission lines 60. Respective plural second pads 54 are connected to plural first vias 72, respectively. A plurality of the first transmission lines 60 are communicated with the bottom surface of the printed board 30 from a plurality of the second pads 54 through a plurality of through holes (not shown). Thus, a plurality of the first transmission lines 60 extend radially in the outward direction up to a plurality of the first pads 52 in the bottom surface of the printed board 30.

The respective through holes are positioned underneath the respective second pads 54. The pitch of the plural pads 54 is narrower than that of the plural pads 52. The interval between the plural second pads 54 (that is the interval d2 between ends of pads 54) is narrower than that (the interval d3) between ends of pads 52) of the plural first pads. When the printed board 30 is of a laminated substrate type, a plurality of the first transmission lines 60 may be provided in one layer of the laminated substrates so as to extend radially in the outward direction.

According to the present embodiment, since the build-up board 40 is provided on the top face of the printed board 30, the third pad 58 provided on the build-up board 40 can be made to present high position accuracy. Thereby, the probe needles 50 can be formed in a desired position. A ceramic substrate may be used. When the ceramic substrate is used, the position accuracy of the third pad 58 and probe needle 50 on the build-up board 40 can be increased. It is to be noted that since the epoxy substrate is available at rather a cheap price, the position accuracy of the substrate can be increased with low cost, compared to the costly ceramic substrate.

Moreover, according to the present embodiment, a plurality of the third pads 58 and a plurality of probe needles 50 can be provided with high position accuracy on the top surface of the build-up board 40. Thus, the interval and pitch between the plural third pads 58 as well as the interval and pitch between the plural probe needles 50 can be minimized. In the present embodiment, the pitch of the plural probe needles 50 is approximately 8μm.

Second Embodiment

Figure 4:
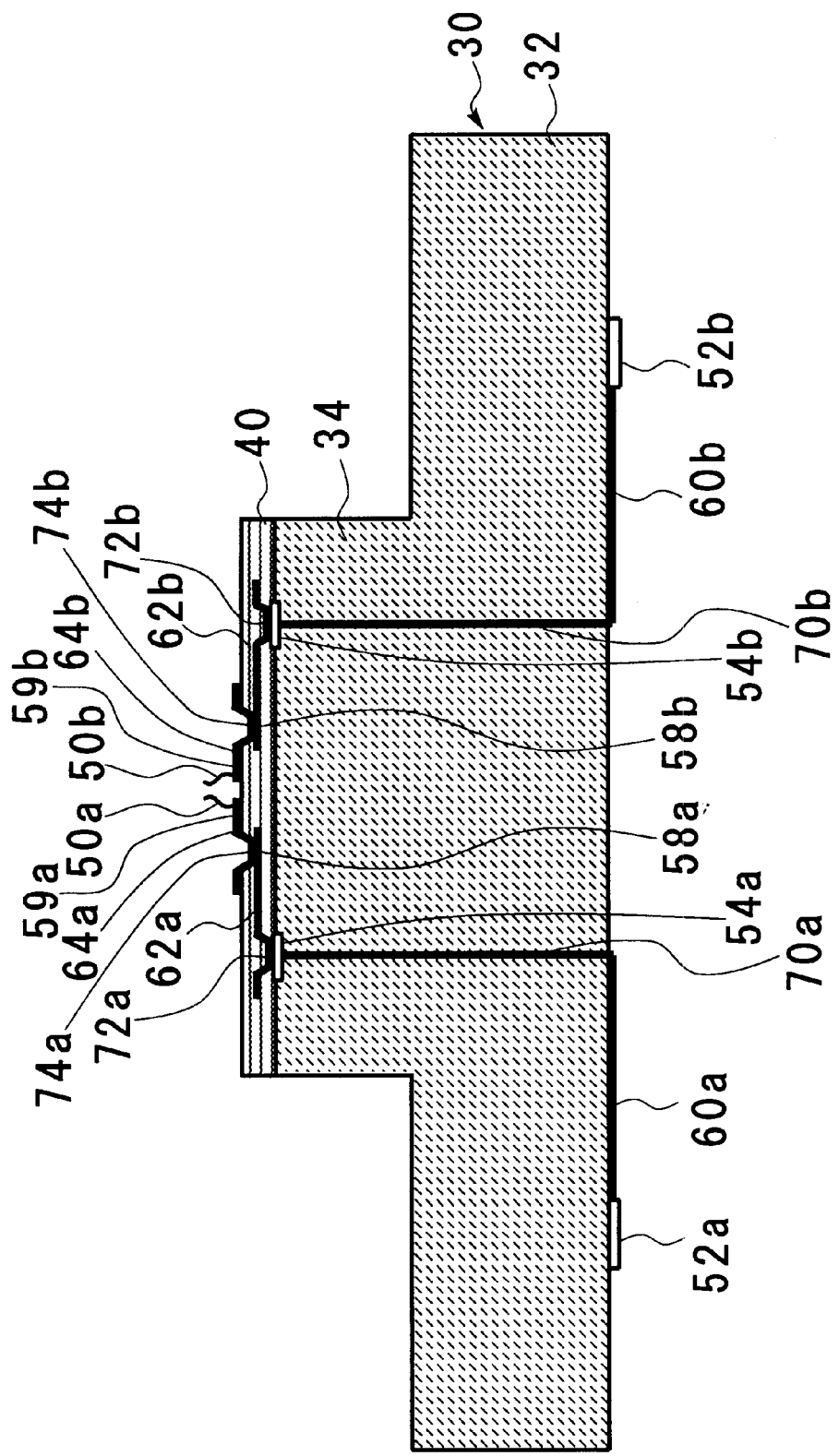
FIG. 4 is a cross sectional view showing the probe card according to the second embodiment.

FIG. 4 is a cross sectional view showing the probe card according to the second embodiment. The second embodiment is similar to the first embodiment except for a point where the build-up board 40 is formed by superimposing two sheets of epoxy material.

When the number of the electrode for the electric components to be probe-tested is a large number such as 1000 pieces or 2000 pieces, the number of the plural probe needles 50 and the plural second transmission lines 62 also increase. In this case, it is difficult to arrange the large number of the second transmission lines 62 extendedly in the radially outside direction on the top face of the build-up board 40. Thus, in the second embodiment, a multi-layered build-up board 40 is formed by laminating the epoxy material to the existing layer. Thereby, part of the second transmission lines 62 is extended in the radially out side direction in one of the multiple wiring layers of the build-up board 40 while the remaining second transmission lines 62 are extended in the radially outside direction in other wiring layer of the build-up board 40. In the present embodiment, two-layered wiring layers are formed by superimposing two sheets of epoxy material.

A plurality of third transmission lines 64a and 64b are provided in a second wiring layer (on the upper face of the epoxy board above the first wiring layer). At each one end of a plurality of the third transmission lines 64a and 64b there are provided fourth pad 59a and 59b, respectively. At each other end of a plurality of the third transmission lines 64a and 64b there are provided the second vias 74a and 74b. A plurality of the third transmission lines 64a and 64b are connected to a plurality of the third pads 58a and 58b through a plurality of the second vias 74a and 74b. A plurality of probe needles 50a and 50b are formed on fourth pads 59a and 59b.

FIG. 5A and FIG. 5B are enlarged plan views of the build-up board 40 according to the second embodiment. FIG. 5A shows the second wiring layer formed on a substrate 42. Probe needles 50c, 50d, 50e, 50f and 50g are connected to the fourth pads 59c, 59d, 59e, 59f and 59g, respectively. The probe needles 50d, 50e and 50f among the probe needles 50c, 50d, 50e, 50f and 50g connect electrically the third transmission lines 64d, 64e and 64f to the electrodes of the electric components. The probe needles 50c and 50g connect electrically the ground wires 66a and 66g to the grounds of the electric components. The third transmission lines 64d, 64e and 64f are communicated to the first wiring layer through the second vias 74d, 74e and 74f. The ground wires 66c and 66g are communicated to the first wiring layer through the second vias 74c and 74g.

FIG. 5B shows the first wiring layer of the build-up board 40. The second vias 74d, 74e and 74f provided on the second wiring layer are connected to contact faces 73d, 73e and 73f on the third pads 58d, 58e and 58f provided on one each end of the second transmission lines 62d, 62e and 62f. The second transmission lines 62d, 62e and 62f are extended in the radially outside direction from the third pads 58d, 58e and 58f. On portion excluding the surface portion having the second transmission lines 62d, 62e and 62f in the first wiring layer there is provided a ground layer. 44 serving as a ground. The second vias 74c and 74g are connected to the contact faces 73c and 73g provided in the second wiring layer in the ground layer 44.

In the ground layer 44 there is provided a via (not shown) which is connected to the ground of the printed board 30. Thereby, the impedance match of the printed circuit 30 and build-up board 40 can be realized. Moreover, since there is provided the ground layer 44, the inductance of the second transmission line 62 can be made small. Therefore, the reliability of signals can be kept high and a power supply noise can be reduced.

Though the two sheets of epoxy members are superposed to each other in the present embodiment, the epoxy member may be superposed for more than three sheets. As the number of laminating layer increases, a space available for the wiring increases. On the other hand, when a long transmission line is provided in parallel to the wiring layer at the periphery of which no ground layer is provided, the crosstalk between transmission lines is likely to increase. Thus, it is desirable that the ground wire be provided between the transmission lines in order to reduce the crosstalk. For example, when the build-up board 40 takes the multi-layered structure, the following method can be adopted. A ground layer is provided in the first wiring layer while a plurality of long transmission lines are provided in the second wiring layer provided on the first wiring layer. The ground layer is not provided in the vicinity of the transmission lines. In these cases, the ground wire will be provided between the transmission lines, and on both ends of the ground wire there will be provided a via connected to the ground layer of the first wiring layer. Thereby, the crosstalk between the transmission lines is reduced, and the impedance match between the first wiring layer and the second wiring layer is realized.

Figure 6:
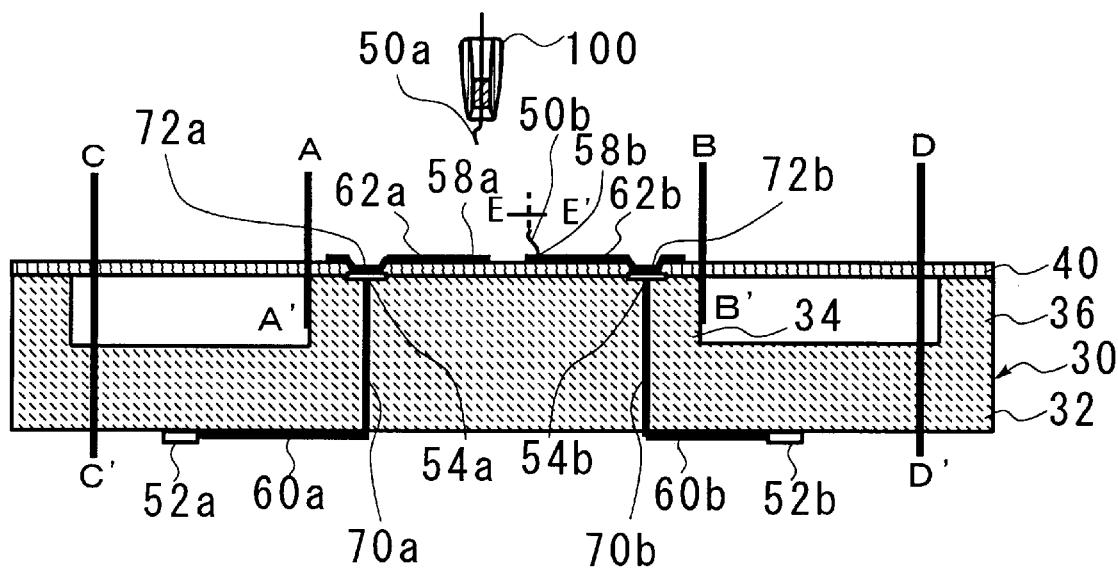
FIG. 6 is a cross sectional view illustrating a manufacturing process of the probe card.

FIG. 6 is a cross sectional view illustrating a manufacturing process of the probe card. The printed board 30 is formed by laminating the glass epoxy. The printed board 30 shown in FIG. 6 is a printed board 30 prior to a processing in the course of manufacturing the probe card. The printed board 30 prior to the processing, includes a flat portion 32, a central protrusion 34 provided on a top surface of a center of the flat portion and a peripheral protrusion 36 which is positioned away from the central protrusion with a predetermined distance away and which is provided on the top surface of a peripheral-side flat portion.

First of all, a plurality of the first transmission lines 60a and 60b are provided in the printed board 30 by the following method. First, a plurality of through holes 70a and 70b are provided in the printed board 30 at predetermined positions. Next, a plurality of the first transmission lines 60a and 60b are provided on the bottom face of the printed board 30. Next, a plurality of the first pads 52a and 52b are provided in each one end of the plural first transmission lines 60a and 60b (at one end in the bottom face side of the printed board 30), and a plurality of the second pads 54a and 54b are provided at each other end of the plural first transmission lines 60a and 60b (at other end in the top face side of the printed board 30).

After a plurality of the first transmission lines 60a and 60b are provided in the printed board 30, a plurality of holes for use with a plurality of the first vias 72a and 72b are provided at predetermined positions of separately prepared film-like epoxy member by a laser processing and the like.

After the holes for use with a plurality of the first vias 72a and 72b are provided in the epoxy member, the epoxy member with the holes having been provided therein is superposed on the printed board 30, and the superposed epoxy member are adhered to the top surfaces of the central protrusion 34 and peripheral protrusion 36 in a fully strained manner by using adhesives. The holes for use with a plurality of the first vias 72a and 72b are positioned above a plurality of the second pads 54a and 54b.

After the build-up board 40 is attached to the printed board 30 in the fully strained manner, the top surface of the build-up board 40 is plated. The inner surface of the holes for use with a plurality of the first vias 72a and 72b and opening base surface thereof are plated so as to form a plurality of the first vias 72a and 72b. Furthermore, a plurality of the second transmission lines 62a and 62b are provided by the etching process.

In a case where the build-upboard 40 is formed by superposing plural sheets of the epoxy members, an epoxy member with plural holes for use with a plurality of the second vias 74a and 74b provided thereon are further attached on the first wiring layer with a plurality of the second transmission lines 62a and 62b provided therein, in the fully strained manner. When the top surface of the epoxy member attached in the fully strained manner is plated and thus the inner surface of the holes for use with a plurality of the second vias 74a and 74b and opening base surface thereof are plated, a plurality of the first vias 72a and 72b are formed. Furthermore, a plurality of the third transmission lines 64a and 64b are provided by the etching process. On respective ends in the top face side of the build-up board 40 of a plurality of the third transmission lines 64a and 64b there are provided a plurality of the fourth pads 59a and 59b.

After a plurality of the second transmission lines 62a and 62b are provided in the build-up board 40, the build-up board 40 is cut, along the planes A–A' and B–B'. Namely, the build-up board 40 is cut along the periphery of the central protrusion 34 of the printed board 30. Next, the printed board 30 is cut along the planes C–C' and D–D'. Namely, the printed board 30 is cut along approximately the inside perimeter of the peripheral protrusion 36. Having performed such cuttings, the probe card according to the present embodiment has the central protrusion 34 and is of a structure such that the build-up board 40 is attached on the top surface of the central protrusion 34.

After cutting the printed board 30 and build-up board 40, a plurality of probe needles 50a and 50b are formed on the top surface of a plurality of the third pads 58a and 58b. A plurality of the probe needles 50a and 50b according to the present embodiment are formed by the following method. First, the tip end portion of the wire is fixed to the third pads 58a and 58b by using a bonding machine 100 for use in fixing the probe needle, and then is cut along plane E–E' by heating the upper portion of the tip end portion in the wire. Thus, the wires which remained in a plurality of the third pads 58a and 58b become the probe needles 50a and 50b having predetermined length. In the present embodiment, the probe needle 50 is a micro needle of length approximately 2 mm.

According to the present embodiment, since a plurality of probe needles 50a and 50b can be provided on the top surface of the build-up board 40 at the high position accuracy, there is no need to manually adjust the position of a plurality of the probe needle 50. Thus, the probe needle 50 can be automatically formed on the third pads 58 by using the bonding machine 100. Moreover, a plurality of probe needles 50a and 50b can be simultaneously formed on a plurality of the third pads 58a and 58b by using the bonding machine 100.

As described above, according to the present embodiments, the build-up board 40 serving as the film-like epoxy board is attached, in a fully strained manner, on the printed board 30 which is the glass epoxy board having high degrees of flatness and mechanical strength. Thereby, there can be formed a probe card having high degrees of surface flatness and mechanical strength.

Moreover, according to the present embodiments, the S-shaped micro-sized needles are used as a plurality of the probe needles 50a and 50b. The S-shaped micro-sized probe needle has elasticity in the vertical directions due to the bent portion thereof. Moreover, the S-shaped micro-sized probe needle is shaped such that one end to be connected to the third pad 58 is displaced, in the horizontal direction, from other end to come in contact with electric components. Thereby, when the probe needle is pressed downwardly by the electrode of the electric components, the both ends of the micro-sized needle are further displaced in the horizontal direction so as to scrabble the electrode of the electric component which comes in contact with the probe. Thus, the S-shaped micro-sized probe needle has a high degree of being contactable to electrodes.

Moreover, according to the present embodiments, since the build-up board 40 is provided on the top surface of the printed board 30, the position accuracy of the probe needles is high at the time of connecting a plurality of the probe needles 50a and Sob. Thus, a great variety of needles including the micro-sized needle can be used as a plurality of the probe needles 50a and 50b. Moreover, the epoxy boards are available at relatively cheap prices, the high position accuracy of the needles can be realized at low cost.

Moreover, since the micro needles are used as a plurality of probe needles 50a and 50b in the present embodiments, the length of non-transmission lines can be made shorter so as increase reliability of signals. Furthermore, since the distance from capacitors provided in the printed board 30 to an electric component to be probe-tested can be made shorten, the power supply noise can be significantly reduced.

Moreover, according to the present embodiments, since a plurality of the third pads 58a and 58b and a plurality of probe needles 50a and sob can be provided, in a highly accurately manner in terms of positions thereof, on the top surface of the build-up board 40, the interval and pitch between a plurality of the third pads 58a and 58b as well as the interval and pitch between a plurality of the probe needles 50a and 50b can be made narrower.

Moreover, according to the present embodiment, since a plurality of probe needles 50 can be provided on the top surface of the build-up board 40 at the high position accuracy, there is no need to manually adjust the position of a plurality of the probe needles 50. Thus, the probe needles 50 can be automatically formed on the third pads 58 by using the bonding machine 100. Moreover, a plurality of probe needles 50a and 50b can be simultaneously formed on a plurality of the third pads 58 by using the bonding machine 100.

As apparent from the above description, according to the present invention, the build-up board is provided on the printed board, so that the position accuracy of the probe needles can be significantly improved.

Although the present invention has been described by way of exemplary embodiments, it should be understood that many changes and substitutions may be made by those skilled in the art without departing from the spirit and the scope of the present invention which is defined only by the appended claims.

What is claimed is:

1. The probe card which comes in contact with electrodes of electric components so as to test characteristics of the electric components, the probe card comprising:

a printed board having a top surface and a bottom surface, said top surface projecting upwards to form a protrusion integral with said printed board;

a plurality of through holes penetrating said printed board from said bottom surface to said top surface through said protrusion; a plurality of first transmission lines provided at least in said plurality of through holes;

a build-up board attached on at least an area of said protrusion where said plurality of through holes are provided;

a plurality of second transmission lines, which are provided on said build-up board, connected to said plurality of first transmission lines; and a plurality of probe needles connected to said plurality of the second transmission lines so as to come in contact with the electrodes of the electric components.

2. The probe card of claim 1, wherein said protrusion is substantially central on said top surface of said printed board.

3. The probe card of claim 2, wherein said build-up board is made in a film-like shape and is attached to said printed board in a fully strained manner.

4. The probe card of claim 2, wherein said build-up board is made of an epoxy material.

5. The probe card of claim 2, wherein each of said plurality of first transmission lines includes a first pad and a second pad at respective ends thereof, said first pad is located at said bottom surface of said printed board and said second pad is located at said top surface of said printed board on said protrusion;

each of said plurality of second transmission lines includes a third pad at one end thereof, said third pad is located at said top surface of said build-up board;

a plurality of vias extending through said top surface of said build-up board for connecting each of second pad to a corresponding one of said plurality of second transmission lines, and each third pad is connected to a corresponding one of said plurality of probe needles.

6. The probe card of claim 5, wherein each probe needle of said plurality of probe needles has elasticity in a vertical direction, a first end of said each probe needle is connected to said each third pad and a second end comes in contact with one of the electrodes of the electric components, said first end of each probe needle is displaced in a horizontal direction with respect to said second end thereof.

7. The probe card of claim 6, wherein said each probe needle is generally S-shaped.

8. The probe card of claim 1, wherein said build-up board is made in a film-like shape and is attached to said printed board in a fully strained manner.

9. The probe card of claim 8, wherein said build-up board is made of an epoxy material.

10. The probe card of claim 1, wherein said build-up board is made of an epoxy material.

11. The probe card of claim 1, wherein each of said plurality of first transmission lines includes a first pad and a second pad at respective ends thereof, said first pad is located at said bottom surface of said printed board and said second pad is located at said top surface of said printed board on said protrusion;

each of said plurality of second transmission lines includes a third pad at one end thereof, said third pad is located at said top surface of said build-up board;

a plurality of vias extending through said top surface of said build-up board for connecting each of second pad to a corresponding one of said plurality of second transmission lines, and each third pad is connected to a corresponding one of said plurality of probe needles.

12. The probe card of claim 11, wherein each probe needle of said plurality of probe needles has elasticity in a vertical direction, a first end of said each probe needle is connected to said each third pad and a second end comes in contact with one of the electrodes of the electric components, said first end of each probe needle is displaced in a horizontal direction with respect to said second end thereof.

13. The probe card of claim 12, wherein said each probe needle is generally S-shaped.

14. The probe card of claim 11, wherein an interval d1 between a plurality of the third pads is narrower than an interval d2 between a plurality of the second pads.

15. The probe card of claim 11, wherein an interval d2 between a plurality of the second pads is narrower than an interval d3 between a plurality of the first pads.

16. The probe card of claim 1, wherein said through holes penetrate said printed board perpendicular to a top surface side of said protrusion where said probe needles are provided.

17. The method of manufacturing a probe card for use in testing characteristics of electric components, the method comprising:

preparing a first substrate having a top surface and a bottom surface, said top surface projecting upwards to form a protrusion integral with said first substrate;

forming a plurality of through holes penetrating said first substrate from said bottom surface to said top surface through said protrusion;

forming first transmission lines at least in said through holes;

superposing a second substrate on the first substrate;

forming second transmission lines on a top surface of the second substrate connected to said first transmission line;

cutting the first and second substrates in a predetermined shape; and forming a probe needles on the second substrate.

18. The method of claim 17 in which said top surface of the first substrate includes a flat portion, said protrusion is substantially central on the flat portion, and a peripheral protrusion, which is disposed away from the substantially central protrusion at a predetermined distance, and which is provided at a periphery of said flat portion of the first substrate, wherein said cutting includes:

cutting the second substrate along a periphery of the central protrusion, and cutting the first substrate along an inner periphery of the peripheral protrusion.

19. The method of claim 17, wherein said forming the probe needle includes forming simultaneously a plurality of the probe needles.

20. The method of claim 17, wherein said forming the probe needle includes: fixing, by a bonding machine which fixes a wire on the second substrate, a tip portion of the wire to the second substrate; and cutting a portion above the tip portion of the wire by heating the portion.

21. The method of manufacturing a probe card for use in testing characteristics of electric components, the method comprising:

forming a first transmission line in a first substrate which includes a flat portion, a substantially central protrusion provided on a top surface of a substantially center of the flat portion and a peripheral protrusion which is disposed away from the substantially central protrusion with a predetermined distance and which is provided on the top surface of a peripheral-side of the flat portion;

superposing a second substrate on the first substrate;

forming a second transmission line in the second substrate;

cutting the second substrate along a periphery of said central protrusion;

cutting the first substrate along an inner periphery of said peripheral protrusion; and forming a probe needle on the second substrate.

\* \* \* \* \*